(12) United States Patent
Fujieda et al.

(10) Patent No.: US 6,930,313 B2
(45) Date of Patent: Aug. 16, 2005

(54) EMISSION SOURCE HAVING CARBON NANOTUBE, ELECTRON MICROSCOPE USING THIS EMISSION SOURCE, AND ELECTRON BEAM DRAWING DEVICE

(75) Inventors: Tadashi Fujieda, Mito (JP); Kishio Hidaka, Hitachiohta (JP); Mitsuo Hayashibara, Hitachinaka (JP); Shuichi Suzuki, Hitachi (JP); Yoshimichi Numata, Mito (JP); Toshiaki Horiuchi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/636,701

(22) Filed: Aug. 8, 2003

(65) Prior Publication Data

US 2004/0026629 A1 Feb. 12, 2004

(30) Foreign Application Priority Data

Aug. 12, 2002 (JP) ........................................ 2002-234297

(51) Int. Cl.$^7$ ................................................ H01J 37/06
(52) U.S. Cl. ................ 250/423 R; 250/310; 250/492.2; 250/423 F
(58) Field of Search ............................ 250/310, 492.2, 250/423 R, 423 F

(56) References Cited

U.S. PATENT DOCUMENTS 5,763,880 A * 6/1998 Nisiyama et al. ........... 250/310
6,528,785 B1 * 3/2003 Nakayama et al. ......... 250/306
6,700,127 B2 * 3/2004 Schneiker et al. ....... 250/423 F
6,705,154 B2 * 3/2004 Nakayama et al. ........... 73/105
6,787,769 B2 * 9/2004 Nakayama et al. ......... 250/306

OTHER PUBLICATIONS

Fransen et al., "Field emission energy distributions from individual multiwalled carbon nanotubes", Applied Surface Science, 146 (1999), pp. 312–327.*

* cited by examiner

*Primary Examiner*—Jack I. Berman
(74) *Attorney, Agent, or Firm*—Antonelli, Terry, Stout & Kraus, LLP

(57) ABSTRACT

A high reliability emission source is constructed to secure the ohmic contact between a carbon nanotube and an electrically conductive base material, so as to ensure sufficient joining strength, and to provide for easy beam shaft adjustment. An electron microscope for realizing high resolution, high brightness, a reduction in sample damage due to a reduction in acceleration voltage, a reduction in cost and compactness, and an electron beam drawing device for realizing high definition, high efficiency, a reduction in cost and compactness in comparison with the conventional device, is achieved by using this high reliability emission source. In the emission source, the carbon nanotube is attached to the tip central portion of the electrically conductive base material through an electrically conductive joining material or an organic material by carbonization-processing the organic material by heat treatment, or by diffusive joining.

18 Claims, 10 Drawing Sheets

EMISSION SOURCE HAVING CARBON NANOTUBE, ELECTRON MICROSCOPE USING THIS EMISSION SOURCE, AND ELECTRON BEAM DRAWING DEVICE

BACKGROUND OF THE INVENTION

The present invention relates to an emission source having a carbon nanotube, and to an electron microscope and an electron beam drawing device using this emission source.

The following four conditions are required to further increase the resolution and brightness of the electron microscope. (1) The size of the emission source needs to be reduced. (2) The brightness of the emission source needs to be increased. (3) The electron energy width from the emission source needs to be reduced so as to reduce the influence of chromatic aberration. (4) An emitted electron beam needs to be stabilized.

There are various unknown types of electron emission source, including a thermal type made of $LaB_6$, a Schottky type made of ZrO/W, and a field emission type made of tungsten in which the tip of a needle is sharpened by electric field polishing. From the point of view of high resolution and high brightness, the emission source of the field emission type is excellent, but it has the following defects. (1) Since no field emission is generated unless a super high vacuum state of $10^{-8}$ Pa or more is set, an exhaust system of large-size is required, so that it is difficult to make the device compact, and the cost is increased. (2) Since no field emission is generated unless the drawing-out voltage is set to high value, such as several kV, an organic material and an organism relating sample, which hold promise for rapid growth in the future, are greatly damaged, and so a sufficiently high accuracy observation can not be made. (3) The emission electric current is greatly changed over time by an emitter tip shape change due to the influence of a residual gas molecule adsorbed and desorbed on the emitter surface and due to the impact of a residual gas ion thereon.

In a length measuring SEM (CDSEM) of the type used in a semiconductor manufacturing process, etc., a Schottky type emission source is used at present. However, a higher resolution under a low acceleration voltage has become an important objective to prevent electric charging on the observation sample and to reduce damage to the sample.

Further, in an electron beam drawing device for irradiating an electron beam to a sample substrate that is coated with a resist that is sensitive to the electron beam for forming various kinds of circuit patterns, an emission source for obtaining a micro probe diameter is required, since the various kinds of circuit patterns are highly defined. Thermal electron emission type sources constructed of tungsten and $LaB_6$ are conventionally used However, these emission sources have certain advantages in that the beam electric current can be set to be large, but astigmatism caused by the size of an absolute emitter tip radius is large, so that no drawing of 20 nm or less can be performed. Therefore, the field emission type source has been used recently. However, a new problem exists in that the beam electric current is unstable due to the smallness of the beam electric current and the above-mentioned cause. Accordingly, the exposure amount of the electron beam, i.e., the exposure time, must be increased to reliably perform the drawing, so that there is the disadvantage of a reduction in efficiency.

On the other hand, the use of an emission source constructed by arranging many carbon nanotubes in a plane substrate has recently received considerable attention as a new emission source for a display device. This is because the carbon nanotube has the following characteristics. Namely, since the tip diameter of a carbon nanotube is very small, being at a nano level, the field emission can be performed even at low voltage. Further, since the bonding between carbon atoms is very strong in comparison with a metal, the carbon nanotube is strong against the above-mentioned ion impact, the emission electric current has excellent stability and electrons are emitted even in a relatively low vacuum.

Therefore, if a single carbon nanotube, or a bundle-shaped carbon nanotube made up of several carbon nanotubes apparently set to one bundle, is employed as to the emission source of an electron microscope and the electron beam drawing device, the electron emission site will be at a nano level, so that the electron emission angle will be small and the energy width of the emitted electron will be small. Therefore, high resolution and high definition processing can be performed in comparison with the conventional case.

However, there is almost no known example in which the single carbon nanotube, or the bundle-shaped carbon nanotube having plural carbon nanotubes apparently set to one bundle, is employed as the emission source of an electron microscope and the electron beam drawing device. With respect to the field emission characteristics of the single carbon nanotube, for example, there is only a report of M. J. Fransen, Th. L. van Rooy, P. Kruit, Appl. Surface Sci. 146(1999) 312–327, etc.

The carbon nanotube emission source disclosed in the above-referenced report has a structure in which a carbon nanotube 1 is fixed by carbon contamination 2 on the tip side face of a tungsten needle 3 serving as a base material, as shown in FIG. 1. In such a structure, since the contact area of the tungsten needle 3 and the carbon nanotube 1 is very greatly reduced, the following problems cannot be solved when this structure is employed as the emission source of an electron microscope and an electron beam drawing device. (1) No ohmic contact is affected between the carbon nanotube and the tungsten needle, the electric resistance in a joining portion is increased, and the electric field intensity at the carbon nanotube tip is considerably reduced in comparison with the applied voltage so that the field emission threshold voltage is increased. (2) In a state in which an electric current flows to a certain extent, the supply of an electron to an electron emission site is prevented for the above-stated reasons, and the electric current is saturated even when a greater voltage is applied. Accordingly, no large electric current can be obtained. (3) The amount of heat generated in the joining portion (joint) is increased for the above reasons, so that the tungsten needle serving as a base material is dissolved. (4) Since the strength of the joint is small, the joint is easily seperated by a charge of static electricity, an impact, etc. (5) Since the carbon nanotube is attached to the side face of the tungsten needle, it becomes difficult to adjust the electron beam axis after assembly thereof into an electron gun.

A method of coating the tip portion of an electrically conductive needle with catalyst metallic particles and directly growing the carbon nanotube from the catalyst metallic particles by the CVD method, etc. is known. However, there is no example of manufacture of the carbon nanotube having excellent electron emission characteristics, while simultaneously satisfying the requirements of crystallinity, purity and fineness of the grown carbon nanotube. Further, the diameter of the grown carbon nanotube depends on the diameter of the catalyst metallic particle, and it is necessary to arrange one catalyst metallic nano-particle at the electrically conductive needle tip, so that it is very difficult to manufacture. Even when one carbon nanotube can be grown from the catalyst metallic nano-particle, the catalyst metallic particle is moved in a carbon nanotube growing direction together with the growth of the carbon nanotube. Therefore, the catalyst metallic particle is lost in the joint of the electrically conductive needle and the carbon nanotube, so that the problems caused by the above-stated joining defect can not be solved. Further, when the catalyst metallic particle is left, a problem also exists in that plural carbon nanotubes are grown at random from this catalyst metallic particle.

SUMMARY OF THE INVENTION

Accordingly, an object of the present invention is to provide a high reliability emission source able to sufficiently secure the necessary ohmic contact of the carbon nanotube and an electrically conductive base material, and having sufficient joining strength,and which is a beam shaft adjustment can be made easily.

One of means for achieving the above-stated object resides in provision of an emission source having a carbon nanotube, and characterized in that the emission source has an electrically conductive base material, and a carbon nanotube coming in ohmic contact with the electrically conductive base material.

In the alternative, the carbon nanotube coming in ohmic contact with the electrically conductive base material is characterized in that this carbon nanotube has an electrically conductive joining material joined to said electrically conductive base material, and a carbon nanotube joined to the electrically conductive joining material. Thus, electric resistance in the joining portion can be reduced, and an increase in the field emission threshold voltage can be prevented, and the amount of electrons supplied to an electron emission site is increased. Further, the amount of heat generated in the joining portion is restrained, and melting, etc. of the electrically conductive base material are prevented, and reliability as the emission source can be increased.

DESCRIPTION OF THE PREFERRED EMBODIMENTS

The various embodiment of the present invention will be explained in detail with reference to the drawings. An electrically conductive needle and an electrically conductive plate, as described in this specification, are set forth as one example of an electrically conductive base material.

(Embodiment 1)

Figure 1:
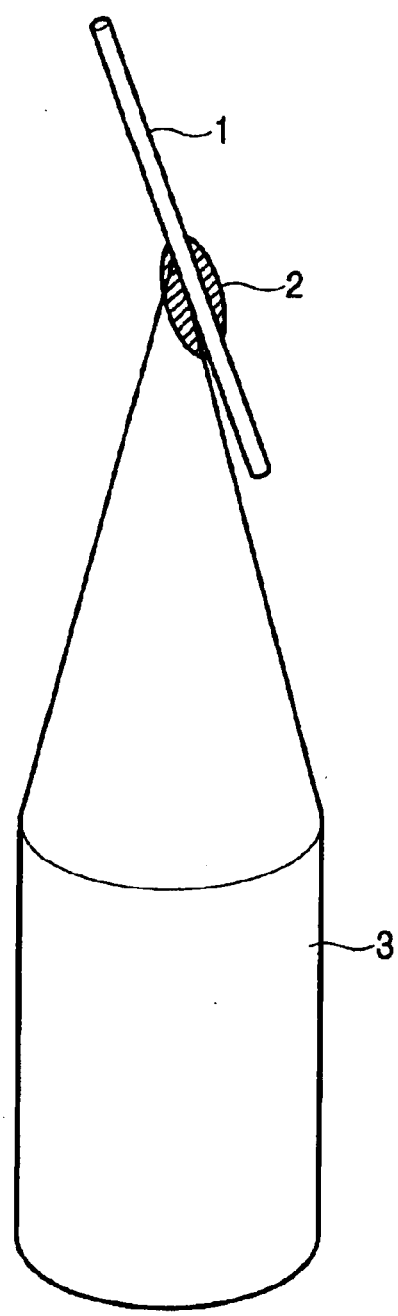
FIG. 1 is a view showing a conventional method of joining a carbon nanotube and an electrically conductive base material.
Figure 2:
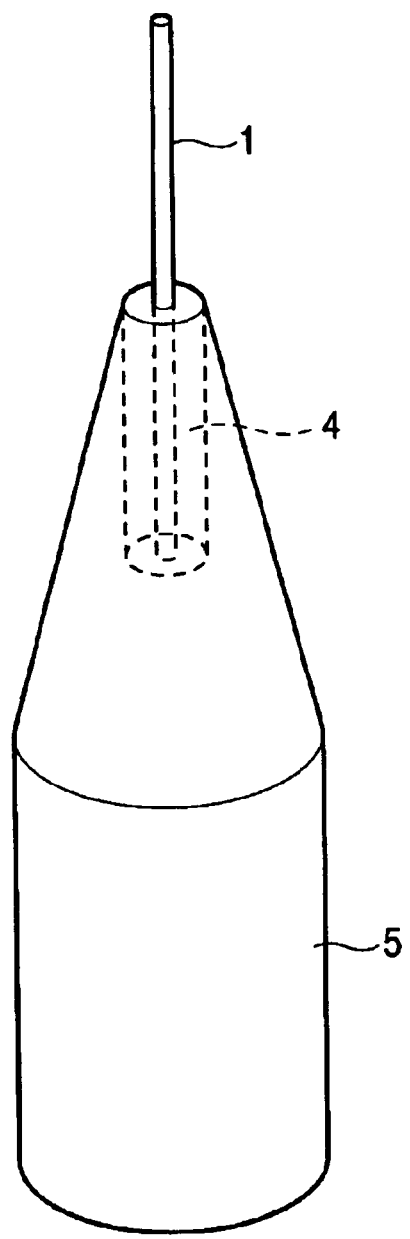
FIG. 2 is a diagram showing an emission source in accordance with embodiment 1.

FIG. 2 shows an emission source in accordance with the present invention. The emission source in accordance with this embodiment has an electrically conductive needle 5 having a micro hole at its tip, an electrically conductive joining material 4 having a melting point lower than that of the electrically conductive needle and arranged in the micro hole, and a carbon nanotube 1 attached to the electrically conductive joining material. Thus, the problem with respect to the joining property of the carbon nanotube and the electrically conductive needle in the emission source can be solved, and the carbon nanotube and the electrically conductive needle can stably come in ohmic contact with each other.

A metal or carbon excellent electrical conductive property, thermal conductive property and oxidation resisting property, and having a relatively high melting point, is preferable as the material of the electrically conductive needle for attaching the carbon nanotube. Tungsten, molybdenum, titanium, platinum, gold or an alloy having these elements is used as the metal, but the metal is not limited to these materials.

The electrically conductive joining material for coating the electrically conductive needle is not particularly limited, if the wettability with the carbon nanotube and the electrically conductive base material is relatively good, and the coefficient of thermal expansion of the electrically conductive joining material is preferably close to that of the electrically conductive base material, and the electrically conductive joining material is melted at a temperature equal to or lower than the melting point of the electrically conductive base material, and is melted at a temperature or is not decomposed even when the carbon nanotube is heated in a vacuum. In view of the manufacturing property, a metal having a melting point of 1500° C. or less is desirable, and a metal or an alloy made of at least one of lithium, beryllium, magnesium, aluminum, potassium, calcium, manganese, cobalt, nickel, rubidium, strontium, tellurium, cesium, barium, lanthanum, bismuth, lead, tin, indium, cadmium, copper, sulfur, selenium, gallium, etc. is used.

Figure 3:
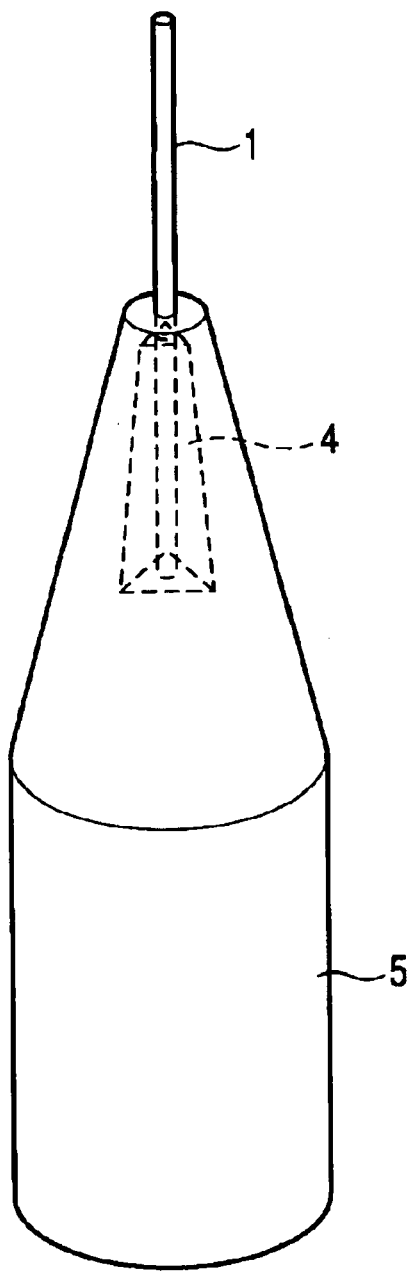
FIG. 3 is a diagram showing another example of the emission source in accordance with the embodiment 1.

The emission source in accordance with this embodiment may be constructed such that the tip portion of an electrically conductive needle having no micro hole formed therein is coated with an electrically conductive joining material having a melting point lower than that of the electrically conductive needle, and the carbon nanotube is attached to the tip portion. However, as shown in FIG. 2, it is more desirable from the point of view of the joining reliability to arrange a micro hole in the tip center portion of the electrically conductive needle. In another arrangement, as shown in FIG. 3, the micro hole is not arranged in the tip center portion of the electrically conductive needle, but a concave portion may be formed in one portion of the electrically conductive needle 5, and the electrically conductive joining material 4 may be arranged in this concave portion, and the carbon nanotube 1 may be attached to the concave portion.

Next a method of manufacture of the emission source in accordance with this embodiment will be described. First, a micro hole (or a concave portion, etc.) is formed by FIB processing or the photolithograph method, etc. in the tip center portion of the electrically conductive needle that has been sharpened at its tip by etching, etc. Thereafter, the tip portion of the electrically conductive needle is coated with an electrically conductive joining material, having a melting point lower than that of the electrically conductive needle, by sputtering, evaporation, or dipping, etc. This becomes a material for attaching the carbon nanotube. One carbon nanotube is then inserted into the micro hole that has been coated with the electrically conductive joining material, and the base material is cooled and solidified until the solidifying temperature of the electrically conductive joining material is reached. In this way, the emission source shown in FIG. 2 can be manufactured.

Thus, the ohmic contact of the carbon nanotube and the electrically conductive base material can be secured, and a emission source of high reliability having sufficient joining strength can be provided. Further, it is possible to reduce sample damage due to formation for high resolution, high brightness and a low acceleration voltage in comparison with the conventional device by using this emission source in an electron microscope. Further, since an electron emission angle is small, the diaphragm degree of an electron beam using a condenser lens is reduced, so that one portion or all of the condenser lens can be omitted. Further, in comparison with the conventional emission source, an electron is emitted even in a low vacuum so that a vacuum exhaust system can be simplified. Further, in in comparison with the conventional device, the acceleration voltage can be reduced so that the heat generation around an electron gun is reduced and an electron gun can be sufficiently cooled around its circumference by the air without cooling the electron gun circumference with cooling water, as in the conventional device. Accordingly, since the cooling system can be omitted or simplified, it is possible to provide an electron microscope which is capable of realizing a reduction in cost and compactness, and an electron beam drawing device which is capable of realizing high definition, high efficiency, a reduction in cost and compactness. The electrically conductive needle used for this embodiment represents one example of an electrically conductive base material, and it is offered as a mode which is able to emit the electrons most efficiently.

(Embodiment 2)

Figure 4:
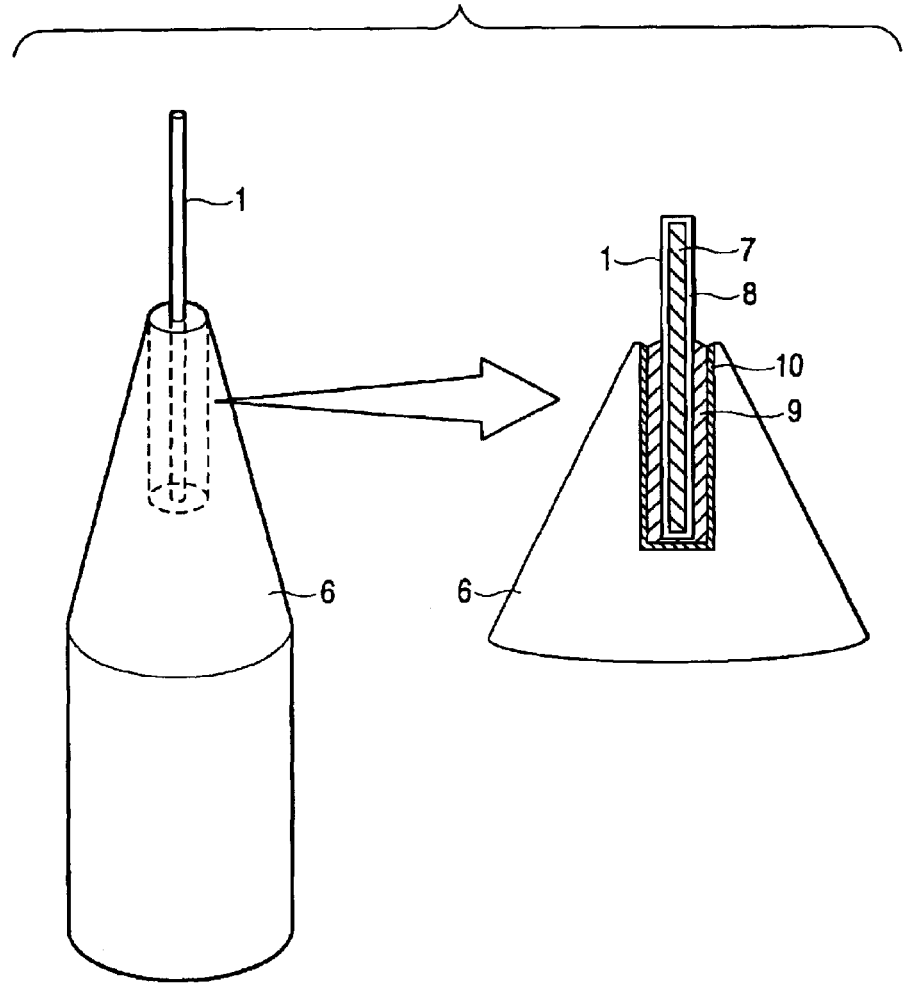
FIG. 4 is a diagram showing an emission source in accordance with an embodiment 2.

FIG. 4 shows an emission source in accordance with this embodiment The emission source in accordance with this embodiment is constructed such that the carbon nanotube of the emission source described with reference to the embodiment 1 is coated with several layers of an electrically conductive material having a melting point higher than that of the electrically conductive joining material (coating layers are arranged). In accordance with this construction, even when the wettability of the electrically conductive joining material with the carbon nanotube is not so good, the wettability can be improved as a whole and the joining reliability can be raised by nipping a material having good wettability with both the electrically conductive joining material and the carbon nanotube. Further, the ion resisting impact property can be further improved by arranging a coating layer around the carbon nanotube. In this case, when the layer (coating layer) for coating the carbon nanotube is too thick, the advantage of a small diameter with respect to the carbon nanotube is reduced. Therefore, each coating layer is preferably set to have a thickness of about several nm to several ten nm.

Here, a specific example with respect to the emission source in accordance with this embodiment will be explained with reference to FIG. 4. The electrically conductive needle 6 is formed of tungsten, and the electrically conductive joining material 9 is formed by a tin-based low melting point alloy. Since the wettability is not so good with respect to the tin-based low melting point metal alloy and the carbon nanotube, a metal having good wettability with the carbon nanotube, e.g., titanium, hafnium, zirconium, tantalum, niobium, chromium, molybdenum, manganese, aluminum, calcium, iron, nickel, cobalt, tungsten, silicon, etc. that is easy to form a carbide, is first formed as a first metal coating layer. Copper, nickel, silver, gold, etc. as a metal having good wettability with both the first metal coating layer and the tin-based low melting point alloy and a melting point higher than that of the tin-based low melting point alloy are formed as a second metal coating layer outside the first metal coating layer. Thus, the wettability with the electrically conductive joining material can be gradually raised from the carbon nanotube side by this composite layer 8, and the tolerance of a material selection can be raised and ion resisting impact property can be improved.

Since the wettability is also not so good with respect to tungsten and the tin-based low melting point alloy used in the electrically conductive needle, a metal such as copper, nickel, silver, gold, etc. having a good wettability with both tungsten and the tin-based low melting point alloy and a melting point higher than that of the tin-based low melting point alloy is preferably formed as a metal coating layer 10 in the entire electrically conductive needle or the tip portion (the micro hole interior or the concave portion). It is a matter of choice whether or not the metal coating layer is arranged in accordance with the wettability. Further, it is possible to select whether the metal coating layer is arranged in the entire carbon nanotube, or whether it is arranged only in a portion relating to the joining in accordance with necessity. In this regard, the coating with the metal coating layer involves not only a case of providing an entire coating, but also includes a case in which the metal coating layer is arranged only in the portion relating to the joining.

Further, no carbon nanotube is not particularly limited, but one carbon nanotube is preferable in view of the size of the emission source. However, when a large electric current is required, as in an electron beam drawing device, etc., a bundle-shaped carbon nanotube made up of several carbon nanotubes (including the metal coating layers) apparently seen as one bundle, also may be used if the overall diameter is 100 nm or less.

The evaporation method, the CVD method, the sputtering method, etc. are available as methods of manufacturing of these metal coating layers.

As mentioned above, it is possible to provide an emission source of high reliability able to secure ohmic contact with the carbon nanotube and the electrically conductive base material, and which has sufficient joining strength and good wettability between the respective materials and a high ion resisting impact property. Further, it is possible to provide an electron microscope that is capable of exhibiting high resolution, high brightness, a reduction in sample damage due to a reduction in acceleration voltage, a reduction in cost and compactness, and an electron beam drawing device that is capable of exhibiting high definition, high efficiency, a reduction in cost and compactness in comparison with the conventional device by using this emission source in the electron microscope.

(Embodiment 3)

Figure 5:
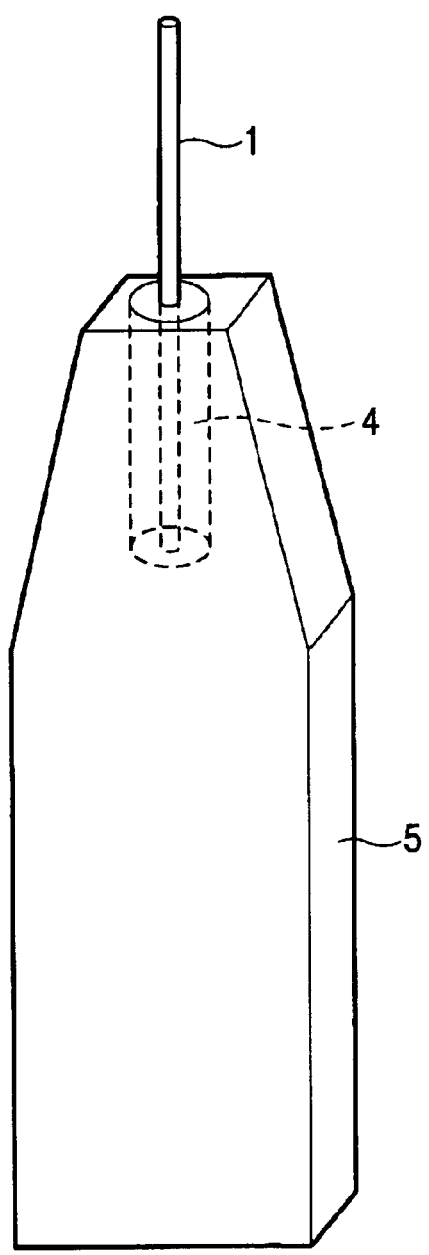
FIG. 5 is a diagram showing an emission source in accordance with an embodiment 3.

FIG. 5 shows an emission source in accordance with this embodiment.

The emission source in FIG. 5 is constructed such that this emission source has an electrically conductive plate 5 having a sharp tip shape (tip portion) and a micro hole in its tip portion, an electrically conductive joining material 4 having a melting point lower than that of the electrically conductive needle arranged in the micro hole, and a carbon nanotube 1 attached to the electrically conductive joining material. With respect to the shape of the electrically conductive base material for attaching the carbon nanotube, the tip of the electrically conductive plate is preferably sharp to a certain extent, since an electric field is easily concentrated onto the tip as the tip shape is sharpened.

(Embodiment 4)

Figure 6A:
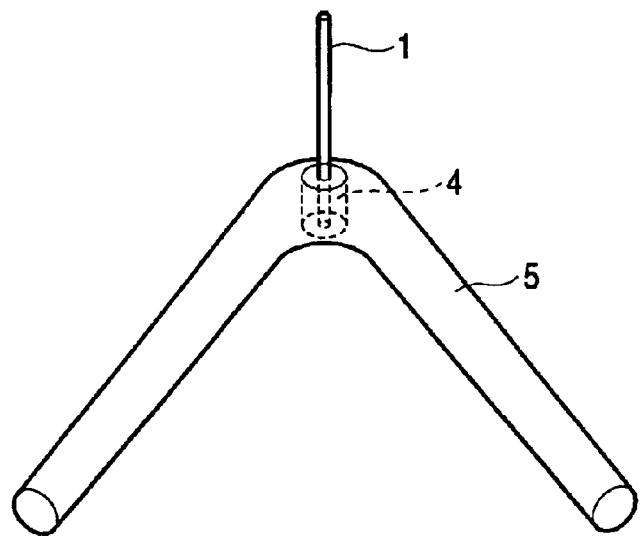
FIG. 6A is a diagram showing an emission source in accordance with an embodiment 4.
Figure 6B:
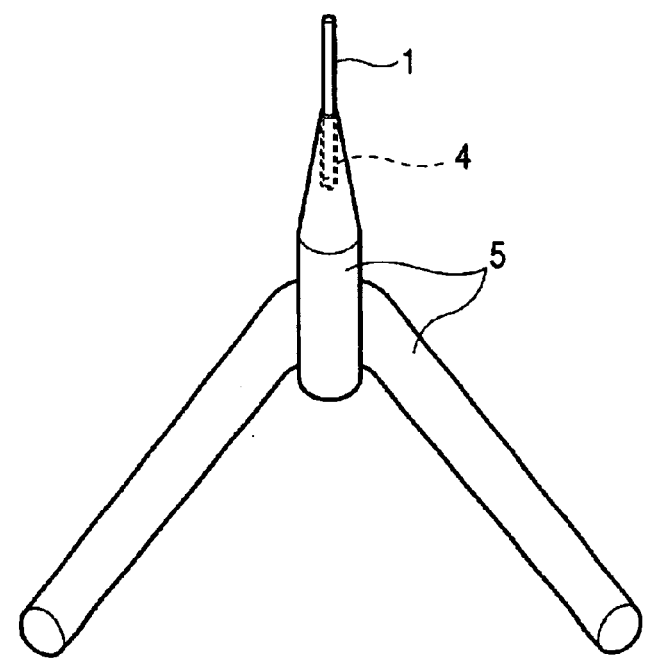
FIG. 6B is a diagram showing another form of the emission source in accordance with the embodiment 4.

FIGS. 6A and 6B show emission sources in accordance with this embodiment.

The emission source in FIG. 6A has an electrically conductive base material 5 of a V-shaped filament shape having a micro hole in a V-shaped portion (tip portion), an electrically conductive joining material 4 having a melting point lower than that of an electrically conductive needle arranged in the micro hole, and a carbon nanotube 1 attached to the electrically conductive joining material.

The emission source in FIG. 6B has an electrically conductive base material 5 having a V-shaped filament shape, including an electrically conductive needle attached to the V-shaped portion (tip portion) of the electrically conductive base material having the V-shaped filament shape and having a micro hole at the tip, an electrically conductive joining material 4 having a melting point lower than that of the electrically conductive needle arranged in the micro hole, and a carbon nanotube 1 attached to the electrically conductive joining material.

With respect to the shape of the electrically conductive base material for attaching the carbon nanotube, the electric field is easily concentrated onto the tip as the tip shape is sharpened. Therefore, it is possible to provide an emission source of high output and high reliability by concentrating the electric field by forming the plate to be sharp to a certain extent. Further, since the electrically conductive base material is formed in the V-shaped filament shape in the emission source in accordance with this embodiment, the attached carbon nanotube can be easily heated by causing an electric current to flow through the filament, and an adsorbing gas on the carbon nanotube surface can be removed.

As mentioned above, it is possible to provide an emission source of high reliability able to secure the ohmic contact of the carbon nanotube and the electrically conductive base material so as to provide a sufficient joining strength, in which it is possible and to remove the adsorbing gas on the carbon nanotube surface.

(Embodiment 5)

Figure 7:
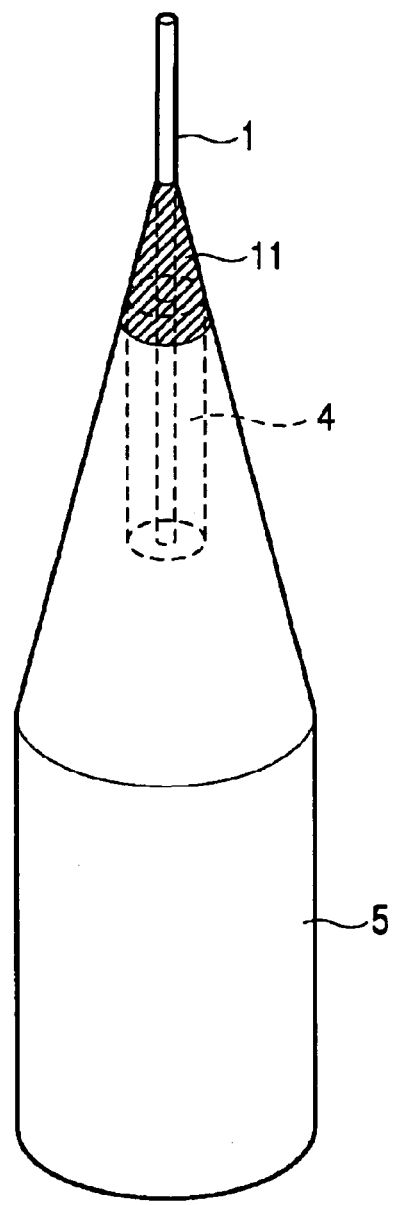
FIG. 7 is a diagram showing an emission source in accordance with an embodiment 5.

An emission source in accordance with this embodiment will be explained with reference to FIG. 7. The emission source in accordance with this embodiment is constructed such that the circumference of a joining portion of the carbon nanotube and the electrically conductive joining material, in the emission source manufactured in the embodiment 1, is coated with a high melting point metal or carbon, and a coating material is provided for sealing the electrically conductive joining material. In other words, this embodiment is characterized in that the emission source has a coating material, and the electrically conductive joining material is sealed by the coating material and the electrically conductive base material.

The joining state can be secured by arranging the coating material in this way, even when the emission source reaches a temperature equal to or greater than the melting point of the electrically conductive joining material. The high melting point metal in this case is a metal having a melting point higher than that of the electrically conductive joining material, and this melting point is desirably set to 1500° C. or more. Further, in this case, the electrically conductive joining material can be omitted, but it is more preferable to use the electrically conductive joining material to facilitate the manufacture.

This emission source can be manufactured by locally evaporating tungsten, carbon, etc. only near the joining portion while irradiation damage of the carbon nanotube itself during the observation of an image is minimized by an FIB processor, etc. utilizing an electron beam instead of e.g., gallium ions near the joining portion of the emission source manufactured by the method described in the embodiment 1.

In this embodiment, the emission source is manufactured similarly to the emission source manufactured in the embodiment 1. However, this embodiment is not limited to the emission source manufactured in accordance with embodiment 1, but the emission source also can be manufactured in a manner similar to that of the emission source described with reference to one of the embodiments 1 to 4, as long as the above-described effects are obtained.

As mentioned above, it is possible to provide an emission source of high reliability in which it is possible to secure the required ohmic contact between the carbon nanotube and the electrically conductive base material, so as to provide a sufficient joining strength, and in which it is possible to secure the joining state even when the emission source is exposed to a temperature equal to or greater than the melting point of a low melting point metal.

(Embodiment 6)

In this embodiment, an operating method of the emission source, using the emission source disclosed in each of the embodiments 4 and 5, will be explained with reference to FIGS. 8A and 8B.

Figure 8A:
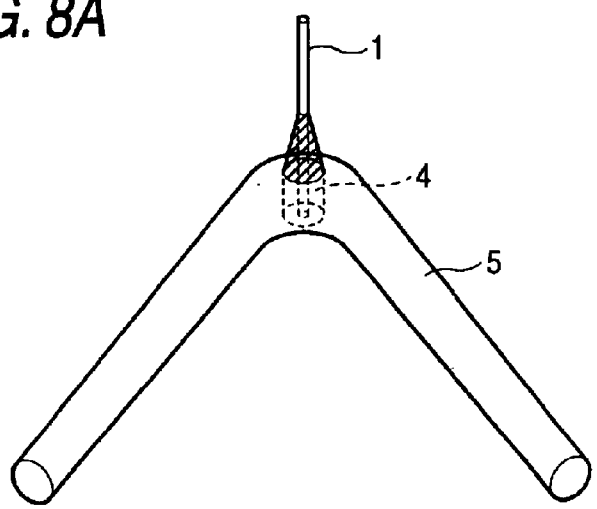
FIG. 8A is a diagram showing an emission source in accordance with an embodiment 6.
Figure 8B:
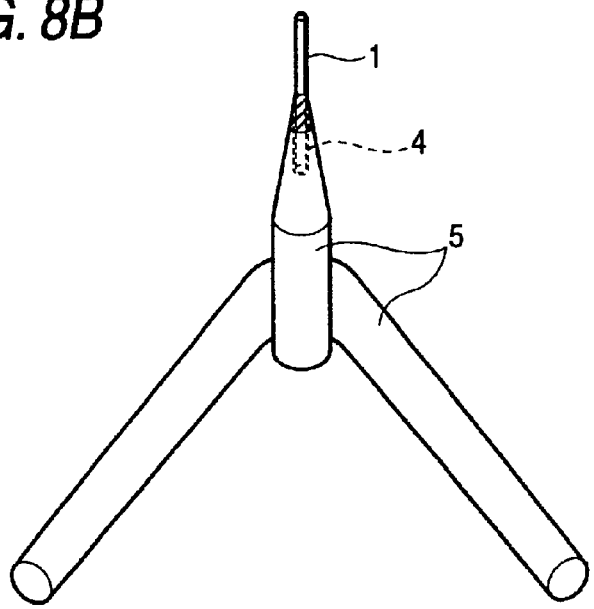
FIG. 8B is a diagram showing another form of the emission source in accordance with the embodiment 6.

Namely, the emission source in FIG. 8A is constructed such that this emission source has an electrically conductive base material 5 having a V-shaped filament shape having a micro hole provided in a V-shaped portion (tip portion) thereof, an electrically conductive joining material having a melting point lower than that of an electrically conductive needle and being arranged in the micro hole, a carbon nanotube 1 attached to the electrically conductive joining material, and a coating material arranged to seal above electrically conductive joining material near the joining portion of the carbon nanotube and the above electrically conductive joining material. The emission source in FIG. 8B has an electrically conductive base material 5 having a V-shaped filament shape, including an electrically conductive needle attached to the V-shaped portion (tip portion) of the electrically conductive base material having the V-shaped filament shape and having a micro hole at the tip thereof, an electrically conductive joining material 4 having a melting point lower than that of the electrically conductive needle arranged in the micro hole, a carbon nanotube 1 attached to the electrically conductive joining material, and a coating material arranged to seal the electrically conductive joining material near the joining portion of the carbon nanotube and the electrically conductive joining material. A flashing free operating method can be executed by using this emission source. This operating method will next be explained in more detail.

In an emission source having this construction, the joining state can be secured even when the emission source is exposed to a temperature equal to or greater than the melting point of the electrically conductive joining material having a low melting point. Therefore, for example, when a critical temperature causing thermal field electron emission from the carbon nanotube is set to $T_1$, and a temperature for separating an adsorbing gas on the carbon nanotube surface is set to $T_2$, and the heating temperature of the carbon nanotube is set to T, an electron beam of a narrow energy width can be stably obtained over a long period without performing conventionally indispensable flashing, even in a vacuum degree considerably lower than the vacuum degree required in the conventional field emission source, by operating the emission source as $T_2<T<T_1$ by adjusting the electric current amount supplied to a filament. Here, the temperature $T_2$ ranges from 500 to 1000° C. However, if the used carbon nanotube lies in a temperature range that is not decomposed by heating, the temperature $T_2$ may also lie in a temperature range equal to or greater than this temperature range. In particular, in a length measuring SEM (CDSEM) of the type used in semiconductor manufacture at present, it is indispensable that it is flashing free. Therefore, only a Schottky type emission source having an inferior resolution in comparison with the field emission type is used. However, a flashing free high resolution observation can be made by executing the emission source in accordance with this embodiment by the above-described operating method.

(Embodiment 7)

Another example of the method of manufacture of the emission source described in the embodiment 1 is considered in this embodiment. This embodiment differs from the embodiment 1 in that the electrically conductive joining material is an organic material that has been changed to graphite.

The method of manufacture of the emission source in accordance with this embodiment is a method of making the emission source described in e.g., the embodiment 1. In this method, a micro hole is formed by FIB processing or a photolithograph method, etc. in the tip center portion of an electrically conductive needle that has been sharpened at the tip by etching, etc. The electrically conductive needle having the micro hole in the electrically conductive tip portion is coated with an organic material in advance, and one carbon nanotube is inserted into the micro hole that has been coated with the organic material and is temporarily fixed. This carbon nanotube is heated until it reaches a temperature for carbonizing the organic material within a vacuum or an inactive gas atmosphere, so that the organic material is changed to graphite. Namely, the organic material is changed to graphite having an electrically conductive property by this process. Therefore, it is possible to manufacture an emission source in which the carbon nanotube and the electrically conductive needle are joined to each other in ohmic contact. If the electrically conductive needle is particularly constructed of carbon in this case, all the materials constituting the emission source are constructed of carbon. This is very advantageous, since the problem with respect to different kinds of materials, such as interface separation in the joining portion caused by a difference in thermal expansion, wettability between the wettability between the respective materials, etc. can be solved.

In this embodiment, an example has been given using the emission source described with reference to embodiment 1 as a source. However, this embodiment can be also applied to the method manufacture of the emission source in accordance with the embodiments 2 to 6 as long as the above-described manufacturing process can be performed (in this case, it is possible to cope with the application by suitably reading a concave portion for the micro hole, etc.).

Figure 9:
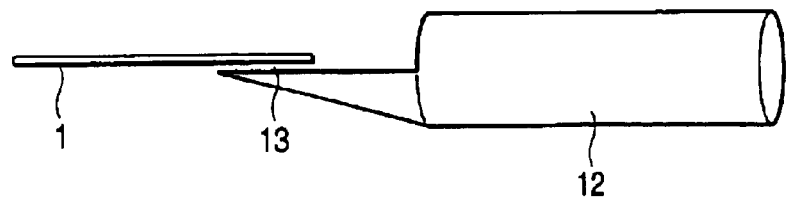
FIG. 9 is a diagram showing an emission source in accordance with an embodiment 7.

Further, after the carbon nanotube is temporarily fixed by carbon contamination, etc. to an electrically conductive base material having the concave portion formed in the tip center portion, as shown in FIG. 3 as an embodiment, or an electrically conductive base material having a tip sectional portion flattened, as shown in FIG. 9, the carbon nanotube and the electrically conductive base material can be diffusively joined to each other by heating the carbon nanotube within a vacuum or an inactive gas. A metal which is easy to form the carbon nanotube and an intermediate product, such as an electrically conductive carbide, etc. is preferable as the electrically conductive base material. For example, Ti, W, etc. are used as the electrically conductive base material. The heating temperature in this case preferably ranges from 500 to 1000° C. If a particle beam, such as ions, an electron beam, etc., is simultaneously irradiated to only the joining portion, the diffusion between the carbon nanotube and the electrically conductive base material is accelerated, so that the diffusive joining can be performed for a short time at a lower temperature.

(Embodiment 8)

Figure 10A:
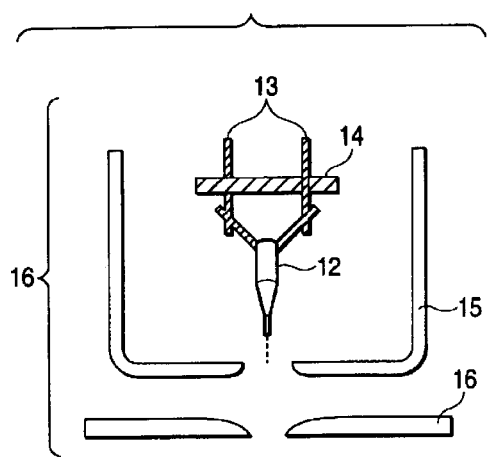
FIG. 10A is a diagram showing the emission source of an electron microscope in accordance with the present invention.
Figure 10B:
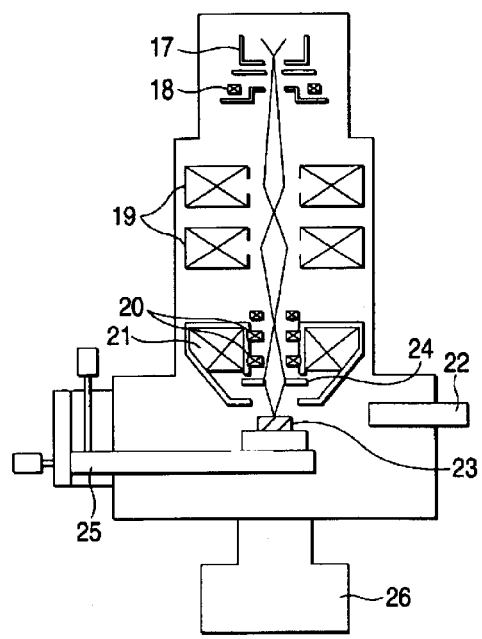
FIG. 10B is a diagram showing the electron microscope in accordance with the present invention.

This embodiment is an example in which the emission source in accordance with the embodiment 1 is used in an electron gun. FIG. 10A shows its construction. FIG. 10B shows an example in which this electron gun is further used in a scanning type microscope.

The electron gun shown in FIG. 10A has an emission source 12, a a strut 13 for supporting the emission source, an insulating substrate 14 for fixing the strut, a first anode 15 and a second anode 16.

The scanning type microscope shown in FIG. 10B is provided with an electron optical system 17, for reducing the size of an electron beam emitted from an electron gun, by an electron lens 19, 20, 24 for focusing and forming a micro electron probe on a sample face, and a deflecting device 21 for moving and scanning the electron probe on the sample. The microscope has a sample chamber in which a sample 23 is mounted on a support 25, and an exhaust system 22, 26 for maintaining the electron optical system and the sample chamber in a vacuum. The construction of an electron optical system in a length measuring SEM (CDSEM) for observing a micro processing pattern in a semiconductor process and measuring the size of this pattern, and an electron beam drawing device for forming various kinds of circuit patterns by irradiating the electron beam to a sample substrate coated with a resist that is sensitive to the electron beam, is also basically the same as shown in FIG. 10A and FIG. 10B.

As mentioned above, it is possible to provide an electron microscope for realizing high resolution, high brightness, a reduction in sample damage due to a reduction in the acceleration voltage, a reduction in cost and compactness, and an electron microscope and an electron beam drawing device for realizing high definition, high efficiency, a reduction in cost and compactness in comparison with the conventional device, by applying the field emission source in accordance with the embodiment 1 to the electron gun of these devices.

Figure 11:
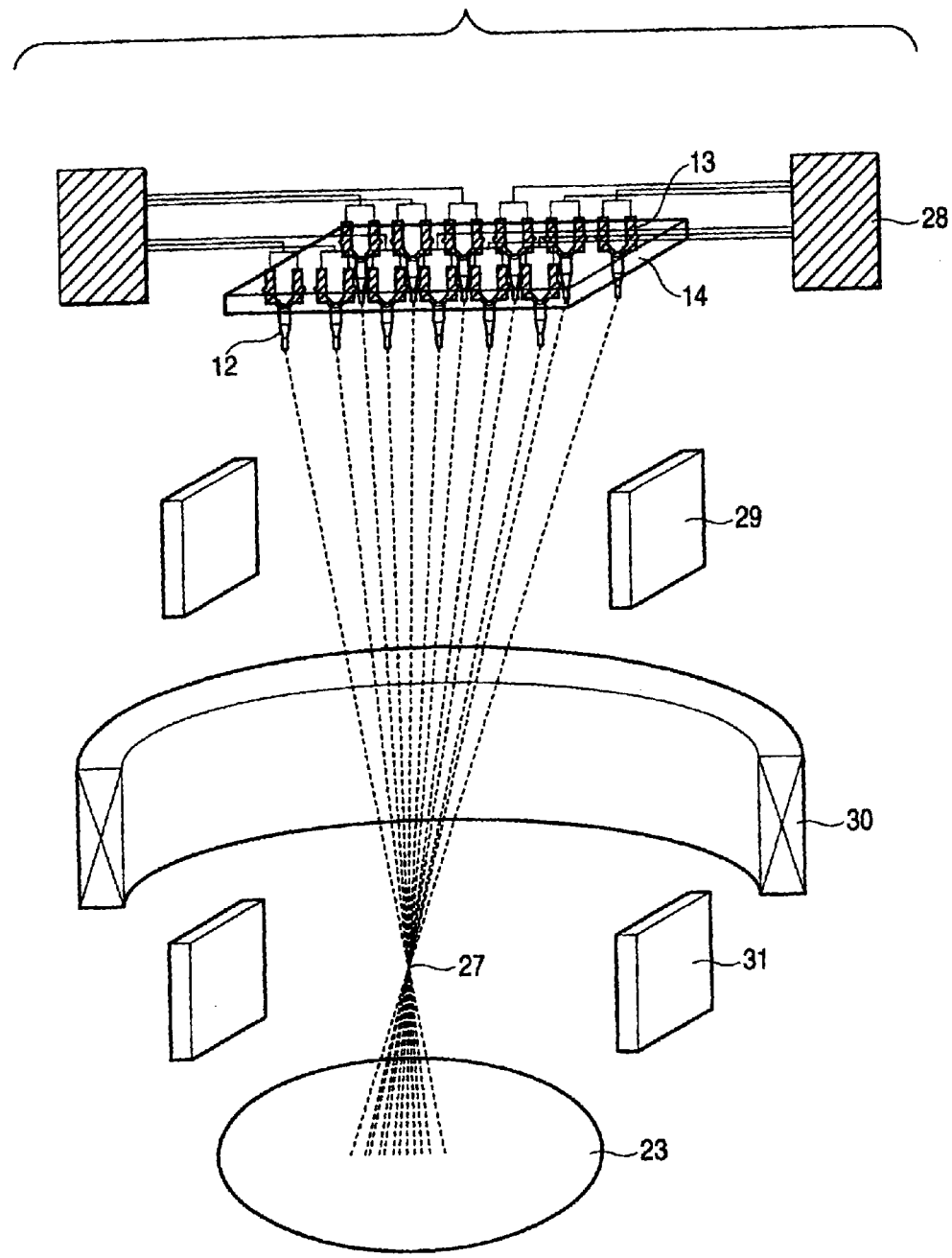
FIG. 11 is a diagram showing an electron beam drawing device in accordance with the present invention.

Further, with respect to the electron beam drawing device, a multi-electron beam source mounting type electron beam drawing device manufactured by two-dimensionally arranging a thin film type emission source (MIM) constructed by a three-layer structure of metal-insulator-metal in a grid shape has recently been developed. Patterns can be collectively transferred by this drawing device so that throughput can be greatly improved in comparison with devices which use one emission source. However, in this case, the electron emission threshold field of the MIM is very high, such as in 1 to 10 MV/cm or more. Therefore, a problem exists in that dielectric breakdown of the insulator or a driving circuit part constituting the MIM, etc. can occur. Accordingly, an emission source able to achieve a high electric current density at low voltage is required. Therefore, the above-described problem can be solved by mounting the emission source of the present invention as shown in FIG. 11.

Similar to a scanning type electron microscope, the fundamental principle of the electronic optical system is the same in a scanning transmission electron microscope in which the electron beam emitted from the emission source is thinly diaphragmed by plural electron lenses, and an image is obtained by scanning this electron beam in a rectangular shape by using a scanning coil. In a transmission type electron microscope, the electron beam emitted from the emission source is accelerated and is irradiated to a sample through electron lenses at plural stages and the electron beam transmitted through the sample is enlarged by plural electron lenses including an objective lens, and an image is projected onto a fluorescent screen. Therefore, similar effects are obtained by using the emission source of the present invention.

As mentioned above, it is possible to provide a high reliability emission source with which it is possible to secure the ohmic contact of the carbon naotube and the electrically conductive base material, so as to exhibit a sufficient joining strength, and in which a beam shaft adjustment can be made easily.

What is claimed is:

1. An emission source comprising:
   an electrically conductive needle having a micro hole at a tip thereof;
   an electrically conductive joining material arranged in the micro hole of the electrically conductive needle; and
   a carbon nanotube at least partially disposed in the micro hole and joined and fastened to said electrically conductive joining material.

2. The emission source according to claim 1, wherein said electrically conductive joining material is a metal having a melting point lower than that of said electrically conductive needle.

3. An emission source according to claim 1, wherein the micro hole at the tip of said electrically conductive needle extends in an axial direction of said electrically conductive needle, and said electrically conductive joining material has a melting point lower than that of said electrically conductive needle and is graphite.

4. An emission source according to claim 1, wherein the micro hole at the tip of said electrically conductive needle extends in an axial direction of said electrically conductive needle, said electrically conductive joining material has a melting point lower than that of said electrically conductive needle, and said carbon nanotube is joined and fastened to said electrically joining material by diffusion bonding.

5. An emission source comprising:
   an electrically conductive needle having a micro hole;
   an electrically conductive joining material arranged in the micro hole of the electrically conductive needle; and
   a carbon nanotube joined to said electrically conductive joining material,
   wherein said carbon nanotube is coated with a first metallic coating layer having a melting point higher than that of said electrically conductive joining material.

6. The emission source according to claim 5, wherein said carbon nanotube has a second metallic coating layer having a melting point higher than that of said electrically conductive joining material, and coating said first metallic coating layer.

7. The emission source according to claim 5, wherein the emission source further comprises a coating material, and
   said electrically conductive joining material is sealed by the coating material and said electrically conductive needle.

8. The emission source according to claim 5, wherein said electrically conductive joining material is constructed by carbonization-processing an organic material.

9. The emission source according to claim 5, wherein said electrically conductive needle is arranged in an electrically conductive base material of a V-shaped filament shape.

10. The emission source according to claim 5, further comprising an electrically conductive base material and said carbon nanotube coming in ohmic contact with the electrically conductive base material.

11. An electron microscope characterized in that the emission source according to claim 5 is used.

12. An electron beam drawing device characterized in that the emission source according to claim 5 is used.

13. An emission source comprising:
    an electrically conductive needle having a micro hole;
    an electrically conductive joining material arranged in the micro hole of the electrically conductive needle; and
    a carbon nanotube joined to said electrically conductive joining material,
    wherein a metallic coating layer having a melting point higher than that of said electrically conductive joining material is arranged between said electrically conductive needle and the electrically conductive joining material.

14. An emission source
    further comprising an electrically conductive base material and a carbon nanotube coming in ohmic contact with the electrically conductive base material;
    wherein the carbon nanotube coming in ohmic contact with the electrically conductive base material has:
    an electrically conductive joining material joined to said electrically conductive base material; and
    a carbon nanotube joined to the electrically conductive joining material;
    wherein said carbon nanotube is coated with a first metallic coating layer having a melting point higher than that of said electrically conductive joining material.

15. The emission source according to claim 14, wherein said electrically conductive joining material is a metal having a melting point lower than that of said electrically conductive base material.

16. The emission source according to claim 14, wherein said electrically conductive base material is formed in a V-shaped filament shape.

17. The emission source according to claim 14, wherein said electrically conductive joining material is constructed by carbonization-processing an organic material.

18. The emission source according to claim 14, wherein said electrically conductive base material has a micro hole, said electrically conductive joining material is arranged in the micro hole, and said carbon nanotube is at least partially disposed in the micro hole and joined and fastened to said electrically conductive joining material.

* * * * *